United States Patent
Li et al.

(10) Patent No.: US 8,486,843 B2
(45) Date of Patent: Jul. 16, 2013

(54) METHOD OF FORMING NANOSCALE THREE-DIMENSIONAL PATTERNS IN A POROUS MATERIAL

(75) Inventors: Xiuling Li, Champaign, IL (US); David N. Ruzic, Pesotum, IL (US); Ik Su Chun, Champaign, IL (US); Edmond K. C. Chow, Urbana, IL (US); Randolph E. Flauta, Barangay Kapitolyo Pasig (PH)

(73) Assignee: The Board of Trustrees of the University of Illinois, Urbana, IL (US)

( * ) Notice: Subject to any disclaimer, the term of this patent is extended or adjusted under 35 U.S.C. 154(b) by 34 days.

(21) Appl. No.: 13/062,130

(22) PCT Filed: Sep. 1, 2009

(86) PCT No.: PCT/US2009/055590
§ 371 (c)(1),
(2), (4) Date: May 13, 2011

(87) PCT Pub. No.: WO2010/027962
PCT Pub. Date: Mar. 11, 2010

(65) Prior Publication Data
US 2011/0263119 A1    Oct. 27, 2011

Related U.S. Application Data

(60) Provisional application No. 61/094,319, filed on Sep. 4, 2008.

(51) Int. Cl.
*H01L 21/311*    (2006.01)
*H01L 21/3213*   (2006.01)

(52) U.S. Cl.
USPC ........... 438/753; 438/637; 438/745; 977/888; 257/E21.219

(58) Field of Classification Search
USPC ................. 216/17, 39, 56, 99; 257/E21.215, 257/E21.219, E21.231; 438/745, 753, 689, 438/911; 977/814, 888
See application file for complete search history.

(56) References Cited

U.S. PATENT DOCUMENTS

| | | | |
|---|---|---|---|
| 6,762,134 B2 | 7/2004 | Bohn et al. | 438/745 |
| 6,790,785 B1 | 9/2004 | Li et al. | 438/745 |

(Continued)

FOREIGN PATENT DOCUMENTS

| | | |
|---|---|---|
| WO | WO 03/054928 A2 | 7/2003 |
| WO | WO 2007/047822 A2 | 4/2007 |

OTHER PUBLICATIONS

Tsujino et al. "Morphology of nanoholes formed in silicon by wet etching in solutions containing HF and H2O2 at different concentrations using silver nanoparticles as catalysts" Electrochimica Acta 53, Jan. 30, 2007, pp. 28-34.*

(Continued)

*Primary Examiner* — Jenny L Wagner
*Assistant Examiner* — Abbigale Boyle
(74) *Attorney, Agent, or Firm* — Brinks Hofer Gilson & Lione

(57) ABSTRACT

A method of forming a nanoscale three-dimensional pattern in a porous semiconductor includes providing a film comprising a semiconductor material and defining a nanoscale metal pattern on the film, where the metal pattern has at least one lateral dimension of about 100 nm or less in size. Semiconductor material is removed from below the nanoscale metal pattern to create trenches in the film having a depth-to-width aspect ratio of at least about 10:1, while pores are formed in remaining portions of the film adjacent to the trenches. A three-dimensional pattern having at least one nanoscale dimension is thus formed in a porous semiconductor, which may be porous silicon. The method can be extended to form self-integrated porous low-k dielectric insulators with copper interconnects, and may also facilitate wafer level chip scale packaging integration.

21 Claims, 7 Drawing Sheets

U.S. PATENT DOCUMENTS

| | | | | |
|---|---|---|---|---|
| 7,718,254 | B2* | 5/2010 | Matsumura et al. | 428/317.9 |
| 8,193,095 | B2* | 6/2012 | Lin et al. | 438/700 |
| 8,278,191 | B2* | 10/2012 | Hildreth et al. | 438/460 |
| 8,334,216 | B2* | 12/2012 | Lin et al. | 438/745 |
| 2002/0123227 | A1 | 9/2002 | Winningham et al. | 438/700 |
| 2004/0169281 | A1 | 9/2004 | Nguyen et al. | 257/758 |
| 2005/0120902 | A1 | 6/2005 | Adams et al. | 101/483 |
| 2006/0199193 | A1* | 9/2006 | Koo et al. | 435/6 |
| 2006/0215154 | A1* | 9/2006 | Chan et al. | 356/244 |
| 2006/0240681 | A1 | 10/2006 | Williams et al. | 438/800 |
| 2007/0173073 | A1* | 7/2007 | Weber | 438/787 |
| 2007/0194453 | A1* | 8/2007 | Chakraborty et al. | 257/777 |
| 2008/0001290 | A1* | 1/2008 | Chou et al. | 257/751 |
| 2013/0052762 | A1* | 2/2013 | Li et al. | 438/22 |

OTHER PUBLICATIONS

Lee et al. "Pore formation in silicon by wet etching using micrometre-sized metal particles as catalysts" Journal of Materials Chemistry 18, Jan. 2008, pp. 1019.*

Definition of line: "http://www.dict.org/bin/Dict?Form=Dict2&Database=*&Query=line" Accessed Dec. 12, 2012.*

Williamson et al., "Porous GaN as a Template to Produce Surface-Enhanced Raman Scattering-Active Surfaces", J. Phys. Chem. Aug. 25, 2005. vol. 109, pp. 20186-20191.*

Borini, Stefano et al., "*Electron-Beam Irradiation of Porous Silicon: Application to Micromachining,*" Journal of Applied Physics 93, 8, (2003) pp. 4439-4441.

Borini, S. et al., "*Patterning of Porous Silicon by Electron-Beam Lithography,*" Journal of the Electrochemical Society 150, 5, (2003) pp. G311-G313.

Chattopadhyay, Soma et al., "*Direct-Write Patterning of Microstructured Porous Silicon Arrays by Focused-Ion Beam Pt Deposition and Metal-Assisted Electroless Etching,*" Journal of Applied Physics 96, 11 (2004) pp. 6888-6894.

Chattopadhyay, Soma et al., "*In-Plane Control of Morphology and Tunable Photoluminescence in Porous Silicon Produced by Metal-Assisted Electroless Chemical Etching,*" Journal of Applied Physics 91, 9 (2002) pp. 6134-6140.

Chun, Ik Su et al., "*Nanoscale Three Dimensional Pattern Formation in Light Emitting Porous Silicon,*" Applied Physics Letters 92, 191113 (2008) pp. 191113-1-191113-3.

Cruz, Sonaly et al., "*Fabrication and Optimization of Porous Silicon Substrates for Diffusion Membrane Applications,*" Journal of the Electrochemical Society 152, 6 (2005) pp. C418-C424.

Diesinger, H. et al., "*Nano-Structuring of Silicon and Porous Silicon by Photo-Etching Using Near Field Optics,*" Phys. Stat. Sol. 197, 2 (2003) pp. 561-565.

Doan, Vincent V. et al., "*Photolithographic Fabrication of Micron-Dimension Porous Si Structures Exhibiting Visible Luminescence,*" Applied Physics Letters 60, 5 (1992) pp. 619-620.

Duttagupta, S.P. et al., "*Enhancement and Suppression of the Formation of Porous Silicon,*" Journal of Vacuum Science & Technology B, 13, 3 (1995) pp. 1230-1235.

Galeazzo, Elisabete et al., "*Porous Silicon Patterned by Hydrogen Ion Implantation,*" Sensors and Actuators B76 (2001) pp. 343-346.

Kapaklis V. et al., "*Patterning of Porous Silicon by Metal-Assisted Chemical Etching Under Open Circuit Potential Conditions,*" Physica E 38 (2007) pp. 44-49.

Li, X., et al., "*Metal-Assisted Chemical Etching in $HF/H_2O_2$ Produces Porous Silicon,*" Applied Physics Letters 77, 16 (2000) pp. 2572-2574.

Li, Xiuling et al., "*In-Plane Bandgap Control in Porous GaN Through Electroless Wet Chemical Etching,*" Applied Physics Letters 80, 6, (2002) pp. 980-982.

Noguchi, Nobuaki et al., "*High-Resolution Patterning of Luminescent Porous Silicon with Photoirradiation,*" Jpn. J. Appl. Phys. 33 (1994) pp. 590-593.

Ohmukai, M. et al., *Patterned Porous Silicon Formed With Photolithography,* Journal of Materials Science: Materials in Electronics 16 (2005) pp. 119-121.

Sirbuly, Donald J. et al., "*Patterned Microstructures of Porous Silicon by Dry-Removal Soft Lithography,*" Advanced Materials 15, 2 (2003) pp. 149-152.

Steckl, A.J. et al., "*Doping-Induced Selective Area Photoluminescence in Porous Silicon,*" Applied Physics Letters 62, 16 (1993) pp. 1982-1984.

International Search Report and Written Opinion for PCT/US2009/055590; Date of Mailing: Mar. 22, 2010; 5 pages.

* cited by examiner

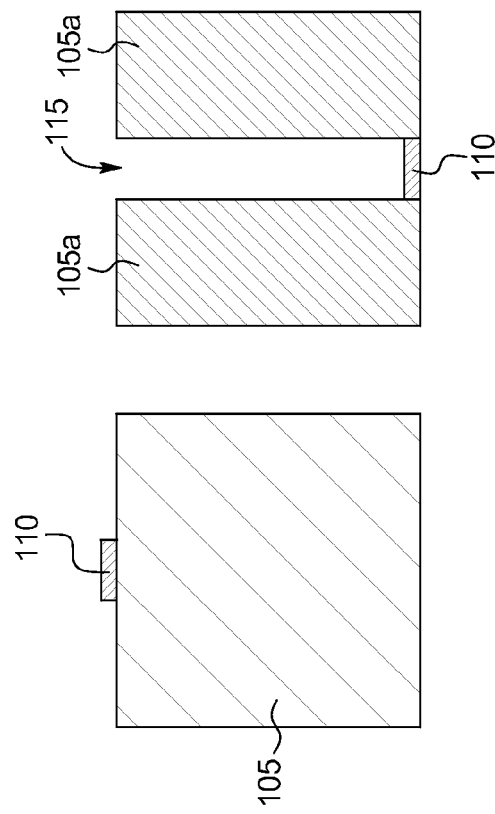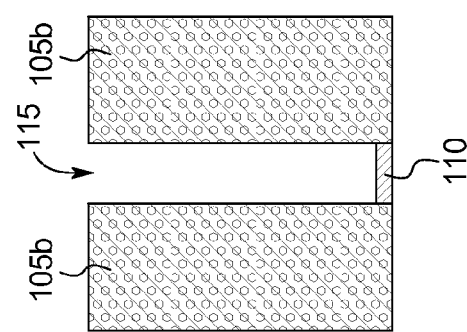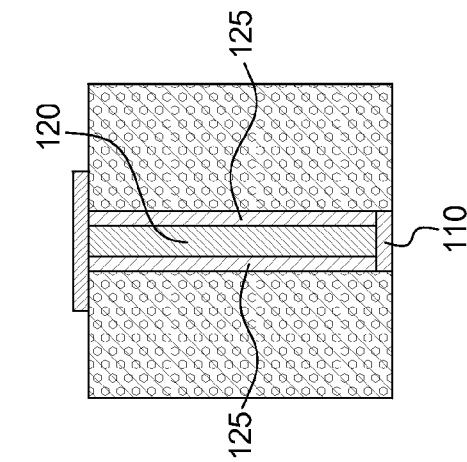

FIG. 4A
FIG. 4B
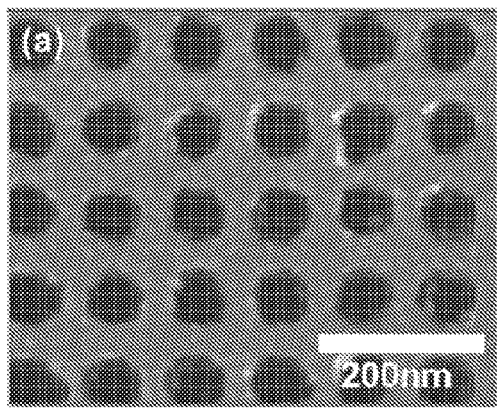
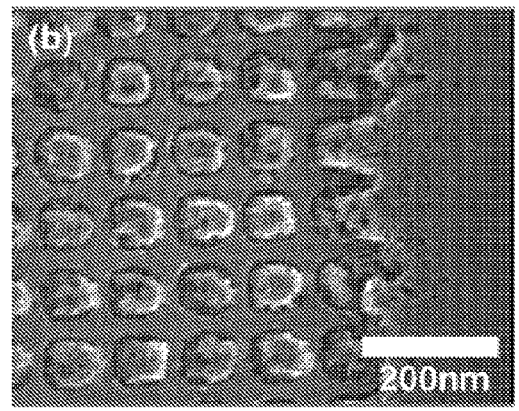

METHOD OF FORMING NANOSCALE THREE-DIMENSIONAL PATTERNS IN A POROUS MATERIAL

The present patent document is the National Stage of International Application No. PCT/US2009/055590, filed Sep. 1, 2009, which claims the benefit of the filing date under 35 U.S.C. §119(e) of U.S. Provisional Patent Application Ser. No. 61/094,319, which was filed on Sep. 4, 2008, and which is hereby incorporated by reference in its entirety.

TECHNICAL FIELD

The present disclosure is directed generally to semiconductor fabrication and more particularly to a method of forming nanoscale three-dimensional patterns in porous semiconducting materials.

BACKGROUND

Porous silicon is a nanostructured material that may be composed of interconnected crystallites and pores having a dimension of 1-100 nm. Promising approaches for micron- and submicron-scale pattern formation in porous silicon have been reported using either lithography methods, which selectively mask the porous silicon removal or generation, or maskless localized treatments of silicon surfaces, which block or enhance porous silicon formation or dissolution. Among the specific techniques used include ion irradiation or implantation, electron beam lithography and irradiation, localized far-field or near-field illumination, dry-removal soft lithography, and lithography with a multilayer electrochemical resistant mask. The spatial resolution of these techniques may be limited by lithography tools or by the fragility and reactivity of porous silicon during formation or etching. As a result, a large-area fabrication method for producing nanoscale (<100 nm) patterned porous silicon is still lacking.

Patterned porous silicon structures are potentially useful for integrated optical and electronic applications. Specifically, the areas of extendability of copper (Cu) interconnects and low dielectric constant (low-k) insulators, novel approaches to interconnects, and the global interconnect problem have been identified as of immediate importance to continued progress in the semiconductor industry. One of the pathways to achieve low-k dielectrics is to incorporate pores into silicon oxide-based materials. A current solution is to create the porous low-k dielectrics first using, for example, spin-on organic polymeric materials, followed by dry etching to create vias and holes for subsequent gap fill with copper. However, the mechanical stability of the porous low-k material makes it susceptible to damage from etching and CMP. The integrity and the cleanliness of interconnect structures are of great concern as the semiconductor industry strives to extend the semiconductor technology roadmap beyond the 32 nm node.

BRIEF SUMMARY

The inventors have developed a method of forming a nanoscale three-dimensional pattern in a porous material that may provide advantages over existing technologies. The method can further be extended to the formation of self-integrated porous low-k dielectric insulators with copper interconnects, and may also facilitate wafer level packaging integration.

The method of forming a nanoscale three-dimensional pattern in a porous semiconductor includes providing a film comprising a semiconductor material and defining a nanoscale metal pattern on the film, where the metal pattern has at least one lateral dimension of about 100 nm or less in size. Semiconductor material is removed from below the nanoscale metal pattern to create trenches in the film having a depth-to-width aspect ratio of at least about 10:1, while pores are formed in remaining portions of the film adjacent to the trenches to create a porous film. A nanoscale three-dimensional pattern is thus formed in a porous semiconductor, which may be porous silicon.

The method of forming self-integrated porous low-k dielectric insulators with copper interconnects comprises providing a film comprising a semiconductor material, and defining a nanoscale metal pattern on the film, where the nanoscale metal pattern has at least one lateral dimension of about 100 nm or less in size. Semiconductor material is removed from below the nanoscale metal pattern to create trenches in the film having a depth-to-width aspect ratio of at least about 10:1, while pores are formed in remaining portions of the film adjacent to the trenches to create a porous film. The porous film is then oxidized to form low-k dielectric features comprising a porous dielectric material having a low dielectric constant. A diffusion barrier metal layer is deposited on sidewalls of the low-k dielectric features, and then copper is deposited between adjacent low-k dielectric features, thereby forming self-integrated porous low-k dielectric insulators with copper interconnects.

BRIEF DESCRIPTION OF THE DRAWINGS

FIGS. 1A-1D illustrate four major steps in the process flow to create a single level self-integrated low-k porous silicon oxide dielectric with copper vias or trenches;

FIGS. 4A-4B are SEM images of a sheet of Ti/Pt with about 70 nm size voids before (FIG. 4A) and after (FIG. 4B) 30 seconds of etching;

DETAILED DESCRIPTION

Figure 2A:
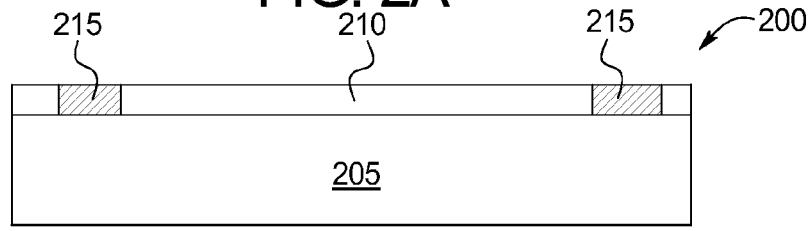
FIGS. 2A-2F illustrate steps in creating etched silicon structures for wafer level die stacking.

The inventors have developed a simple and efficient method for generating three-dimensional (3D) nanoscale patterns in porous silicon or other semiconductors. The method is based on differential chemical etching on and in-between patterned metal features. The effective transfer of various two-dimensional nanoscale (e.g., 10 nm to 100 nm) metal patterns on bulk silicon to a three-dimensional porous silicon network can be achieved with the new method. At least one aspect of the novelty of this approach lies in the simultaneous pattern formation of high aspect ratio vertical trenches and the generation of porous silicon in the surrounding regions. Subsequent oxidation of the porous silicon to form porous silicon oxide low-k dielectrics, followed by metal deposition/electroplating in the nanoscale trenches already seeded with metal, makes it possible to fabricate self-integrated low-k interlayer dielectrics (insulators) with metal interconnects.

FIGS. 1A-1D show exemplary method steps that begin with a planar semiconductor film 105 and an overlying nanoscale metal pattern 110 and may end with one or more metal-filled, high aspect ratio vias 115 surrounded by a low-k dielectric with tunable porosity and elasticity. In the present application, the focus is on porous silicon, although the method is more broadly applicable to other semiconductors. For example, the semiconductor film 105 may include a column IV, III-V, or II-VI semiconductor, such as Si, Ge, GaN, GaAs, InAs, or others. The present method may be employed to create nanoscale, high-aspect ratio features in porous silicon or other semiconductors (FIG. 1B) 105a and further to fabricate self-integrated low-k porous dielectrics 105b (e.g., $SiO_2$) with Cu or other metal interconnects 120 (FIG. 1D). The patterning method can also be applied to produce nanoscale 3D patterns in materials or structures other than planar films.

As used herein, a nanoscale pattern (or nanopattern) is a pattern having at least one lateral dimension (e.g., length or width) of about 100 nm or less in size. The lateral dimension may also be about 50 nm or less in size, or about 25 nm or less in size. A two-dimensional nanoscale pattern may have a thickness that is much smaller than its length or width, whereas a three-dimensional (3D) nanoscale pattern generally has a thickness that is comparable to or larger than its lateral dimensions.

Referring to FIG. 1A, metal nanopatterns 110 that correspond to designed via/trench structures are defined by either electron beam, nanoimprint or EUV lithography. The metal feature size is currently limited by e-beam lithography resolution, which is about 10 nm. As a result, the metal pattern typically has a lateral dimension (e.g., width) of about 10 nm or larger. For example, the pattern may have a lateral dimension of between about 10 nm and about 100 nm, or between about 10 nm and about 40 nm. With advancements in lithographic technology, patterns having smaller lateral dimensions (e.g., less than 10 nm) are also envisioned. The planar semiconductor film can be a single crystalline or polycrystalline film deposited using a low temperature process, such as physical vapor deposition (PVD) or remote plasma chemical vapor deposition (CVD) at a temperature below about 350° C. to maintain the integrity of the other parts of the circuits.

Referring to FIG. 1B, a wet etch in a HF-HOME solution typically consisting of hydrofluoric acid (HF) and an oxidant such as $H_2O_2$ is employed to develop the metal pattern 110 in a reverse fashion. The metal pattern 110 recedes into the semiconductor 105 due to catalytic material removal immediately below the metal 110. Simultaneously, the surrounding semiconductor 105 becomes porous, with the porosity and microstructure depending on the doping type and doping level of the semiconductor 105, the type of metal catalyst 110, and the etching conditions. The etching is preferably done under open circuit, and the metal 110 itself acts as a cathode to stimulate hole generation while the semiconductor 105 itself is the anode. The range of porosity formed in the semiconductor film 105 may be tuned from zero to near unity by applying an external bias to counter hole diffusion out of the metal-semiconductor interface. Damage to the surrounding matrix can be controlled by reverse biasing the semiconductor to vary the speed of the process.

Referring to FIG. 1B, the present inventors have achieved true nanoscale three-dimensional (3D) patterns in porous silicon 105a transferred from two-dimensional (2D) metal nanopatterns 110 in less than about 1-2 minutes of etching time, with controlled topography and other advantageous properties. Via holes 115 of from about 10 nm to about 80 nm in diameter with an aspect ratio (depth-to-lateral dimension (e.g., width)) of greater than 10:1 can be obtained in under 60 s.

The underlying etching technology, where etching is assisted by metal without an external bias, is described in U.S. Pat. No. 6,790,785, which was issued to Li et al. on Sep. 14, 2004, and is hereby incorporated by reference in its entirety. In contrast to conventional methods of producing porous silicon, where an external bias is applied to drive holes ($h^+$) for semiconductor dissolution, metal-assisted porous silicon formation occurs at open circuit. Metal-assisted chemical etching allows patterned porous silicon to be formed because etching proceeds differently on and off the metal and for different substrate doping types and levels. The metal in this method does not act as a mask, but rather as a catalyst for hole ($h^+$) generation for semiconductor dissolution.

The wet-etching is a substantially vertical wall process because the carriers are confined and consumed at the metal-semiconductor junction which resides at the bottom of the trench; thus, the sidewalls formed do not experience further etching as the trenches become deeper. In principle, aspect ratios as high as 100:1 may be created as long as the metal catalyst adheres to the semiconductor surface, although the wet etching generally takes place for less than one minute under open circuit to create nanoscale features having an aspect ratio of about 10:1. Typically, the etching is carried out for a time duration of between about 30 s and a couple of hours.

Referring to FIG. 1C, the porous silicon 105a of FIG. 1B is oxidized to form a porous silicon oxide network 105b. The low temperature oxidation generally involves exposure to an $O_2$ plasma at a temperature in the range of from about 150° C. to about 400° C. Low porosity silicon dioxide films, typically formed from spin-on polymers, have been shown to have a low dielectric constant of about 2.0 to 2.4. Improving the mechanical properties of porous silicon films while maintaining a low dielectric constant is very desirable. Plasma curing over thermal curing has been demonstrated in terms of temperature, time and elasticity. Since the porous silicon oxide 105b may not experience further processing, mechanical strength in this case is less of a concern. Nonetheless, etching, oxidation, and plasma processing conditions may be varied to achieve the optimum porosity and mechanical strength of the porous silicon oxide 105b. The present method is inherently a low damage process because the trench sidewalls are formed during a wet etching process. Furthermore, the process is intrinsically clean because vias or trenches are formed simultaneously with the low-k dielectric; thus, no strip and clean is involved at this step.

Referring to FIG. 1D, second level lithography is carried out to expose via holes/trenches, followed by deposition of a diffusion barrier metal 125 on the sidewalls and then electroplating of Cu interconnects 120 using vapor deposition and electroplating methods known in the art. For example, tantalum (Ta) or tantalum nitride (TaN) can be deposited as barrier materials on the wall of the trenches/vias using Electra IMP technology (Applied Materials) followed by a thin conformal seed layer of Cu before the bulk filling of Cu by electroplating or other methods. The catalyst metal 110 used for the etching process resides at the bottom of the trench 115 formed during etching and thus may also serve as a seed metal for metal electroplating in the vias or trenches 115.

The above process steps can be readily repeated after chemical mechanical planarization (CMP) and a next level low-temperature deposition of silicon to produce interconnect multistacks. Variations of the process flow are envisioned, including removing the catalyst metal and deposition of an alternative metal as a barrier layer before deposition of the copper. In addition, the porosity may be controllable via an external bias by promoting or countering the hole diffusion to the areas beyond the metal. The concept of 3D silicon patterning can also be extended to producing structures in-between devices for wafer-level chip scale packaging (WLCSP), particularly in die stacking of different device platforms. In current flip-chip technologies, die stacking is made on compatible devices, meaning the design of the device to be stacked upon (device 1) should be compatible with the other device (device 2). For different device platforms, this generally means providing some form of a redistribution layer (RDL), interposer or special metal or substrate carrier design to be able to accommodate two or more devices in one package platform. In System in Package (SiP) technology, for example, different dies are typically stacked on a substrate carrier. The compatibility is provided by the substrate interconnect lines. In the current WLCSP process, for both devices (e.g., device 1 and device 2) to be compatible for flip chip die stacking, a redistribution layer is made to provide compatibility. In this case, three different layers are added in the process: the first BCB (benzocyclobutene) polymer layer, the metal redistribution trace, and second BCB layer. The process involves forming a redistribution layer (RDL) that is embedded inside the BCB polymer layers. These BCB layers provide protection to the redistribution layer. With the use of a 3D patterned structure on the silicon layer, different dies can be stacked directly on a "mother" die with the compatibility design on the patterned silicon layer, making the die stacking structure smaller compared to that of existing state-of-the-art WLCSP technologies.

To illustrate the application of the technology to wafer level packaging, FIGS. 2A-2F show a sequence of exemplary steps for creating 3D structures on the wafer level.

FIG. 2A shows a silicon device 205 with passivation layer 210 and bond pads or contact metallization pads 215. This structure may serve as the mother die 200.

Figure 2B:
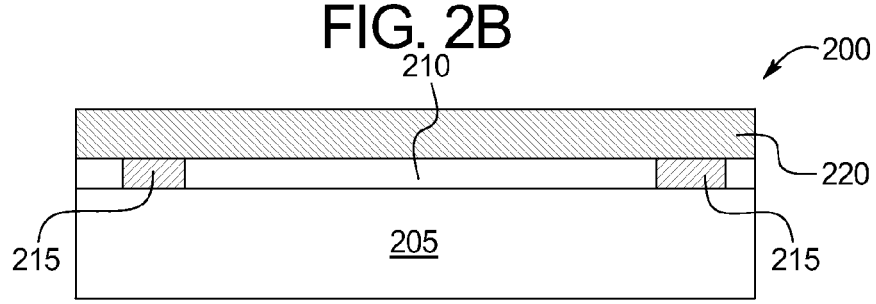

FIG. 2B depicts deposition of a silicon layer 220 on top of the silicon device 205 or the mother die 200.

Figure 2C:
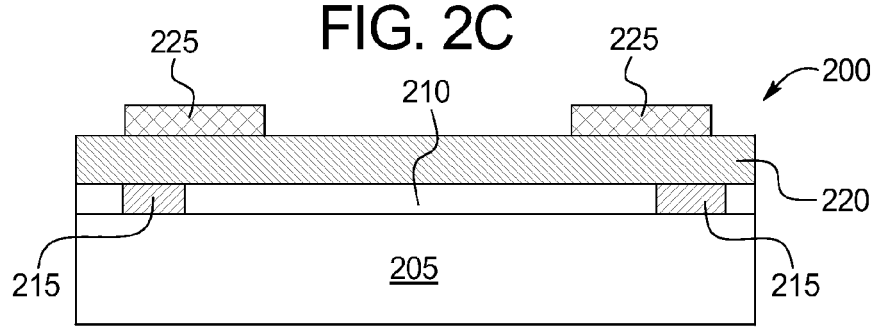

FIG. 2C illustrates deposition of a patterned catalyst metal layer 225. The pattern 225 depends on the different designs of the dies to be stacked on top of the mother die 200.

Figure 2D:
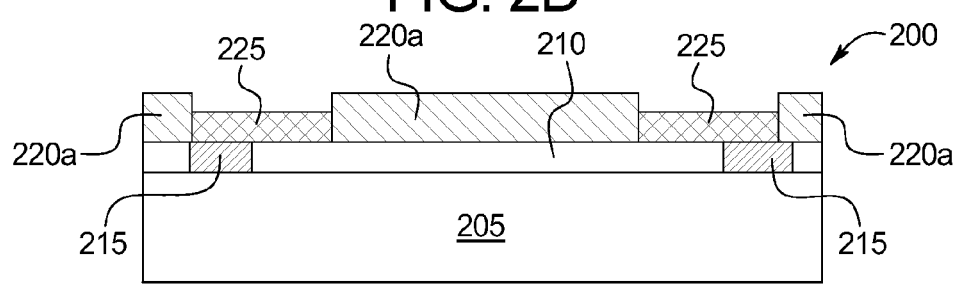

FIG. 2D shows the effect of chemical etching of the silicon layer 220 using the HF-HOME technique. The silicon layer 220 becomes a porous layer 220a, and thus additional plasma treatment can also be made to convert the porous Si 220a into $SiO_2$ (also shown as 220a). This layer 220a will also provide the separation between devices.

Figure 2E:
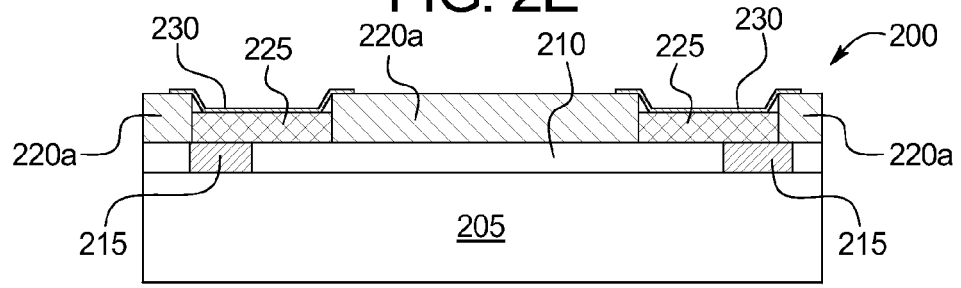

FIG. 2E depicts the deposition of under bump metallization (UBM) 230. The catalyst metal layer 225 remains in contact with the original contact pad metallization and may act as a seed layer for UBM 230 deposition. In other cases, the catalyst metal layer 225 may be removed.

Figure 2F:
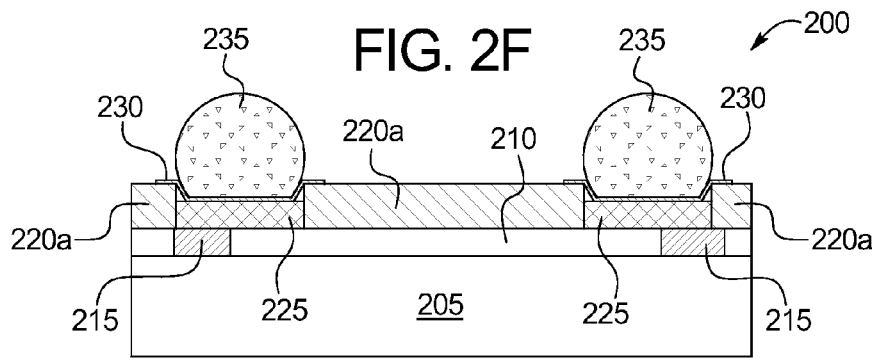
Figure 2G:
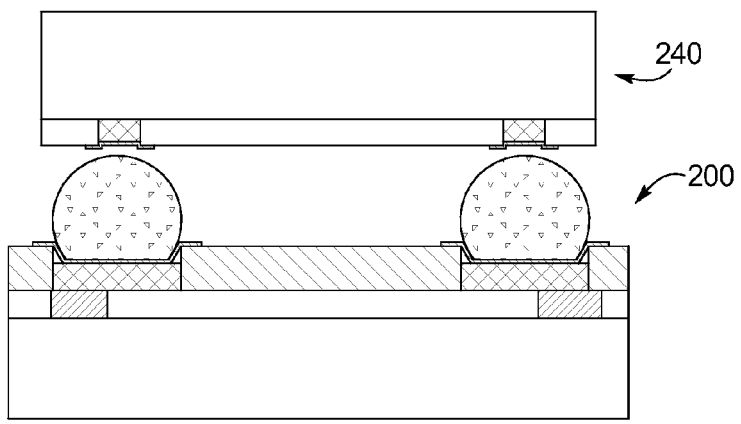
FIG. 2G shows two devices stacked together (e.g., device 1 and 2).
Figure 2H:
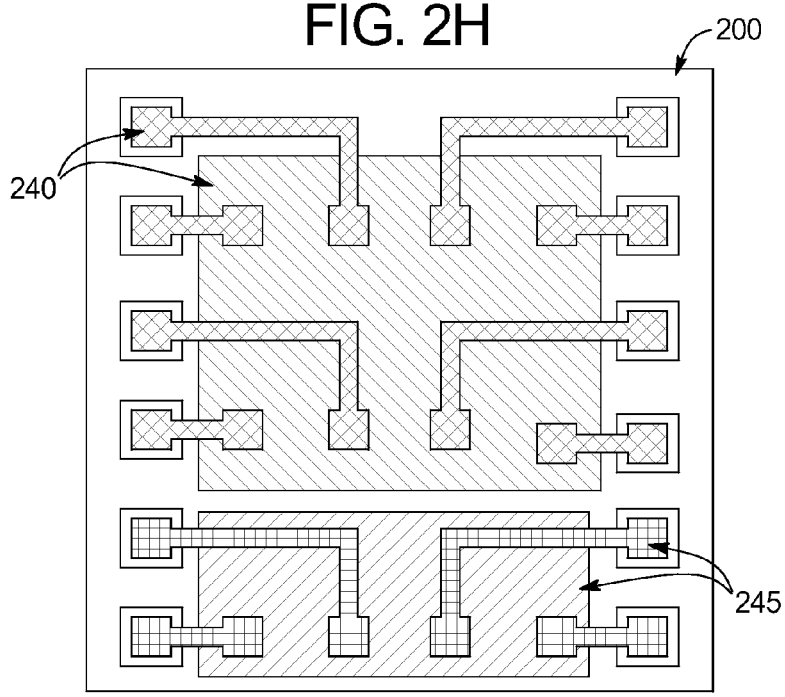
FIG. 2H illustrates different ways of multistacking different device footprints using the procedure of metal-assisted etching.

FIG. 2F shows the formation of a solder bump 235 on top of the UBM structure 230. After creating the 3D structure by etching the silicon layer, additional smaller dies (device 2 240 and device 3 245) may be stacked on top of the mother die (device 1 200), as illustrated in FIGS. 2G and 2H.

Different devices with different functionalities may be integrated on a unique wafer level package by employing the metal-assisted etching of silicon. Using the present method, the overall package dimension may be decreased and smaller dies may be implemented with smaller device footprints.

By employing the method described herein, the inventors believe it is possible to: (1) simply and efficiently produce three-dimensional (3D) nanoscale patterns in porous silicon; (2) produce low-k dielectrics and patterned sub-32-nm high-aspect-ratio trenches and vias simultaneously in a self-integrated manner to meet the future needs of the semiconductor IC interconnect technology; (3) produce 3D structures on Si layers (porous Si or $SiO_2$ after plasma treatment), making the technology applicable to wafer level packaging. The present method can utilize a single larger device platform with smaller dies on top of it to produce more functionalities without changing the overall package platform. There is no minimum feature size limit to the present approach other than the resolution limit of electron beam or EUV lithography (which is currently about 10 nm), and aspect ratios as high as 10,000 to 1 are believed to be possible.

As noted above, the underlying etching technology for the present method, where etching is assisted by metal without an external bias, is described in U.S. Pat. No. 6,790,785. As described in the '785 patent, samples of porous silicon were produced in laboratory-scale experiments by metal-assisted etching. For example, silicon (100) wafers with different doping levels, including: p+ (0.01-0.03 $\Omega$cm), p− (1-10 $\Omega$cm), n+ (0.005-0.02 $\Omega$cm) and n− (10-20 $\Omega$cm) Si, were sputter coated with 30-80 Å of metal (Au, Pt, or Au/Pd) to produce metal structures with ~10 nm or smaller characteristic lateral dimensions (grain size), as revealed by atomic force microscopy (AFM). Removing native oxide from the silicon wafers before sputter coating was not found to be necessary. Aqueous $H_2O_2$ was added to aqueous HF/EtOH solution in a Teflon beaker to produce a solution of 1:1:1 EtOH:HF (49%): $H_2O_2$ (30%) immediately prior to immersing the metal-coated wafers. The etching time can be varied from 2 seconds to 60 min. A mask with rows of 3 mm diameter holes spaced by 6 mm was used to pattern the metal deposition for comparison of etching and luminescence properties in the presence and absence of deposited metal. The development of the pattern deposited using this mask was observed visually upon immersion in the etching solution, with a color change in the metal-coated region from gray to brown then to yellow, depending on the elapsed etching time. Gas evolution from the metal coated area was clearly observed, especially for Pt and Au/Pd. In no case was any metal dissolution observed, in contrast to the behavior if thick continuous layers of evaporated Al are deposited prior to etching.

The inventors believe that etching may occur as a localized electrochemical process, with the metal acting as a local cathode. By this model, microscopically local anode (Si) and cathode (metal) sites form on the etched surface with local cell currents flowing between the sites during etching. The reaction at the cathode generates holes, while the reaction at the anode consumes them in the dissolution of Si. In analogy with the pioneering studies of Si etching, the following mechanism is proposed, Cathode reaction (at metal):

$$H_2O_2+2H+\rightarrow 2H_2O+2h+2H++2e-\rightarrow H_2\uparrow$$

Anode reaction:

$$Si+4h++4HF\rightarrow SiF_4+4H+SiF_4+2HF\rightarrow H_2SiF_6$$

Overall reaction:

$$Si+H_2O_2+6HF\rightarrow 2H_2O+H_2SiF_6+H_2\uparrow$$

A critical feature of this reaction scheme is the generation of h+ from $H_2O_2$ and the reduction of $H^+$ to form $H_2$, both of which are facilitated by the metal particles. Since h+ derives from $H_2O_2$, this mechanism indicates that porous silicon can be generated in the same way regardless of doping type and level, as was observed experimentally. However, the difference in doping level is reflected in the etch depth away from metal-coated areas. In the uncoated areas, higher doping correlates with faster etching and deeper etch depths at fixed times. Since the higher conductivity of the n+ and p+ samples relative to p− samples would facilitate carrier transport, this observation is also consistent with the above mechanism. The observation of much higher etch rates for Pt and Pd than Au suggest a catalytic role. Finally, the proposed $H_2O_2$ is but one possible oxidant, and others may work as well or better—the key feature being the ability to generate mobile holes at the metal-solution interface. For example, nitric acid, and $KMnO_4$ may also be suitable oxidants.

EXAMPLE

Various nanoscale patterns, including dot, mesh, lines, grids, boomerang contour arrays in the range of from about 10 nm to about 100 nm in dimension, were written on PMMA on p− type (100) Si substrates (7 Ωcm) using electron beam lithography at 50 kV. Platinum (Pt) and titanium (Ti) metals were evaporated and followed with standard lift-off. Metal patterned substrates were then etched in a $H_2O_2$ metal-HF (HOME-HF) etchant for 15~60 seconds. Morphology resulted from etching was examined with scanning electron microscopy (SEM) and atomic force microscopy (AFM). Optical properties of the etched samples were also characterized, as described in Chun et al., *Applied Physics Letters* 92, 191113 (2008) 1-3, which is hereby incorporated by reference in its entirety.

Figure 3A:
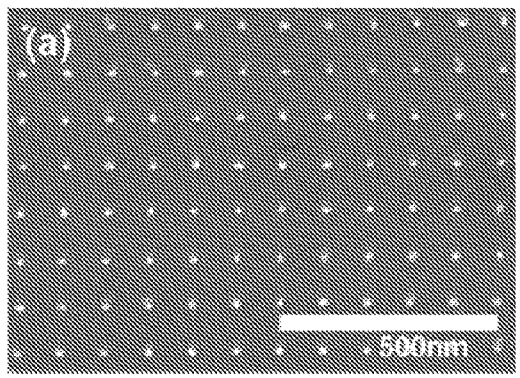
FIGS. 3A-3B are scanning electron microscopy (SEM) images of an array of 15 nm Ti/Pt dots before (FIG. 3A) and after (FIG. 3B) 30 seconds of etching; the inset of FIG. 3B is a close up image of the etched porous structure.
Figure 3B:
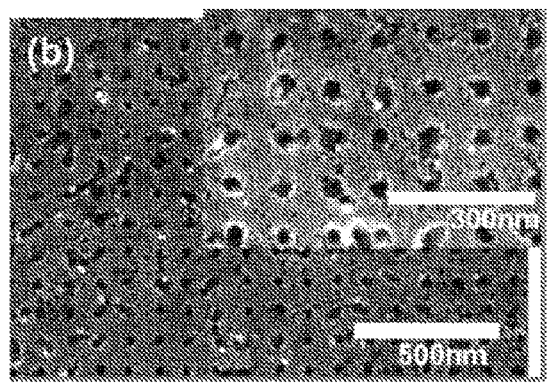
Figure 3C:
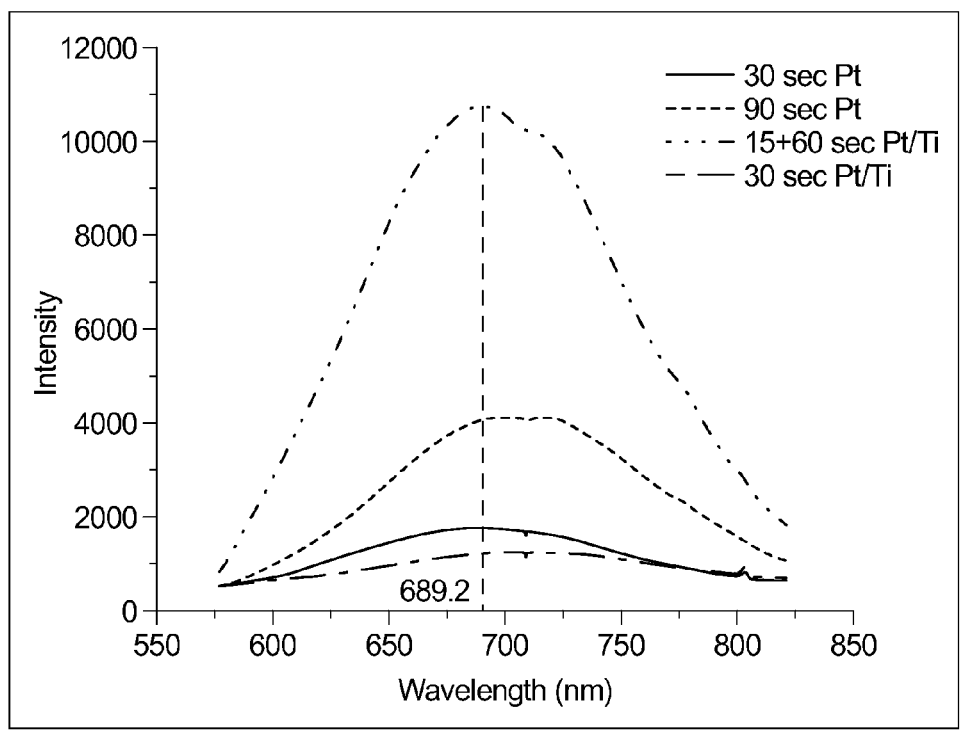
FIG. 3C shows photoluminescence spectra of etched porous structures formed from the metal pattern and etching time indicated.

Shown in FIG. 3A is a SEM image of an array of Ti/Pt dots of 15 nm in height (5 nm Ti followed by 10 nm Pt), 15 nm in diameter and 100 nm in pitch patterned on a p− type silicon substrate. FIG. 3B shows the pattern after 30 s of etching in HOME-HF solution. It can be seen that indentations are formed where the Ti/Pt dots were, while uniform porous structures (see inset of FIG. 3B for close-up image) are formed around the dots. The depth of the indentations is estimated to be on the order of about 60 nm by measuring the cross-section of an array of adjacent line patterns. FIG. 3C shows the photoluminescence spectra of etched porous structures formed with the indicated etching time and the specified metal, confirming the light emitting properties of the porous silicon produced.

When the metal pattern was reversed from dot to mesh (i.e., a continuous Ti/Pt sheet with circular blanks), arrays of pillars were formed where the Ti/Pt mesh voids were located, as shown in FIG. 4A. The pillars are porous in structure and are of the same size as the mesh voids. It can be seen clearly from FIG. 4B that the height difference between the pillars (flush with the starting material shown at the right side of FIG. 4B) and their surrounding, results from the depression in height from areas covered with the Ti/Pt sheet.

Figure 5A:
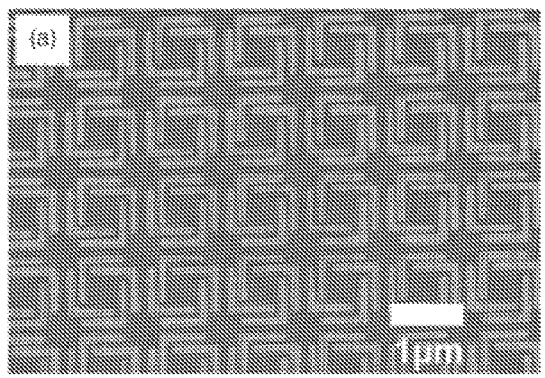
FIG. 5A is an SEM image of as-deposited Ti/Pt metal boomerang contour patterns.
Figure 5B:
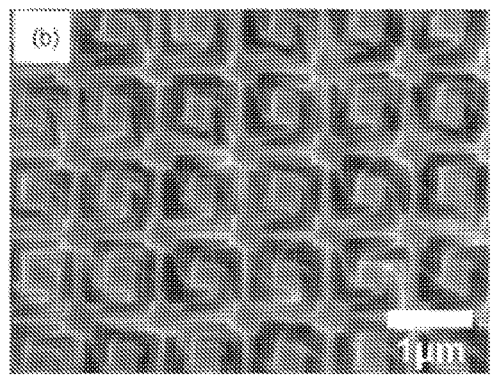
FIG. 5B is an SEM image taken at high beam current of the patterns in FIG. 5A after 30 seconds of etching development.
Figure 5C:
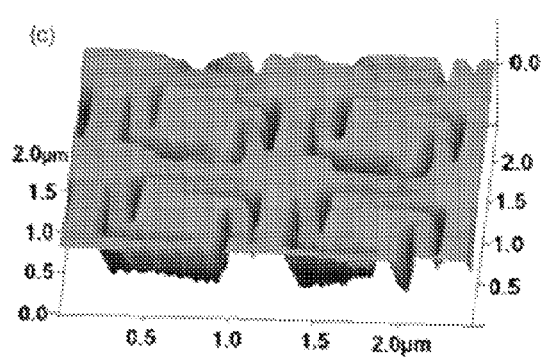
FIG. 5C is a cross-sectional atomic force microscopy (AFM) image showing the 3D nature of the developed patterns.
Figure 5D:
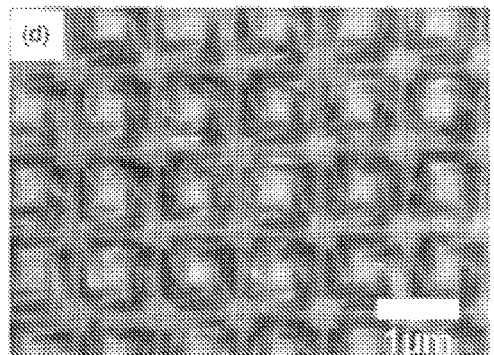
FIG. 5D is a panchromatic CL image of the pattern of FIG. 5B taken at the same beam current.

In order to characterize the topography and uniformity in detail, lithographic metal patterns of relatively large dimensions (but still <100 nm) are studied. Shown in FIG. 5A are as-deposited Ti/Pt contour patterns on a p− type silicon substrate, with the boomerang-shaped arm width at 80 nm and a pitch of 1 μm between the square contours. FIG. 5B shows the SEM image after the pattern is developed in the etching solution for 30 seconds. A 3D view of an AFM surface topology of this developed pattern is shown in FIG. 5C. As materials underneath the metal are removed, the metal appears to conform well to the recessed semiconductor surface, and becomes engraved in the silicon body at the bottom of the trench. AFM line scans over features before and after pattern development show that the as-patterned metal height is only about 11 nm, while the metal pattern after development becomes deep trenches with an average depth of about 100 nm and a standard deviation of about 15 nm. This variation may be related to the imperfect conformities of boomerang patterns to the receding surface. Similar to the dot and mesh patterns, the areas in-between metal features are silicon with fine pores as shown in a high magnification SEM image in FIG. 5F. The light emitting nature is demonstrated in FIG. 5D from a CL panchromatic image, where the high intensity luminescent locations (lighter in color) correspond to areas in-between the metal lines.

Figure 5E:
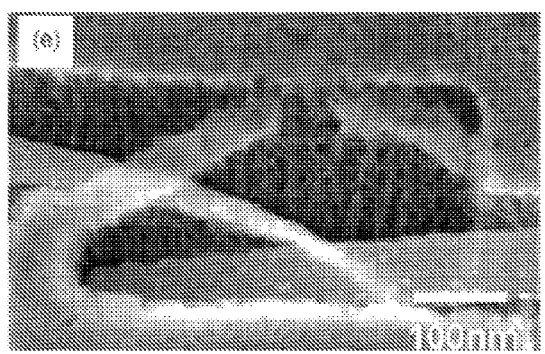
FIG. 5E is a high resolution SEM image revealing the porous structure underneath the metal.

In areas where the metal peels off and the surface underneath is revealed, SEM (FIG. 5E) clearly shows distinct porous features in that region also, but the pore size is much bigger than that of the surrounding areas (those without metal coverage). This is consistent with the macroscopic metal-assisted porous silicon formation behavior on and off metal for p-type silicon, where faster etching directly underneath the metal produces larger, deeper pores while finer, shallower pores are generated in the surrounding areas. However, the top surface remains planar for patterns of millimeter scale. For the nanoscale patterns studied here (10-100 nm), the fast etch rate under the metal leads not only to larger pores but also to material removal (electropolishing), which results in 3D nanoscale structures.

Stripe patterns have also been demonstrated to form 3D porous structures as shown in FIG. 6. The as deposited Ti/Pt stripe patterns on a p− type silicon substrate with stripe width of 80 nm are shown in FIGS. 6A (low magnification SEM) and 6B (higher magnification). FIGS. 6C and D show the SEM images after the pattern is developed in the etching solution for 30 seconds, with clear porous features between the metal stripes, separated by indented metal stripes and near-vertical walls.

In all metal features studied, including dot, mesh, parallel stripes, and the boomerang contours discussed above, a 2D metal pattern on a planar silicon surface may be transferred into a 3D patterned porous silicon network. Referring to FIG. 3B, it can be observed that the size of the indentations in the developed pattern are of slightly larger diameters and more irregular than the original Ti/Pt dots. This may be due to insufficient adhesion of metal dots to the silicon surface during the etching process where $H_2$ gas is generated. For the reverse pattern using metal mesh (FIG. 4B), the metal sheet does not seem to be mobile laterally. However, the fragility of the resulting thin porous pillars appears to limit the spatial resolution and aspect ratio of such structures. In the case of the boomerang contour patterns in FIGS. 5A-5F, the pattern transfer fidelity is better, perhaps due to the larger feature size and correspondingly improved stability of the metal spatial adherence. In general, the 2D to 3D pattern transfer fidelity and resolution limit appear to depend on how well the patterned metal features form a coherent interface with the semiconductor during pattern development, which can be affected by metal feature length and width, as well as etching rate. This is especially important for high aspect ratio patterns where longer etch time is advantageous.

Figure 5F:
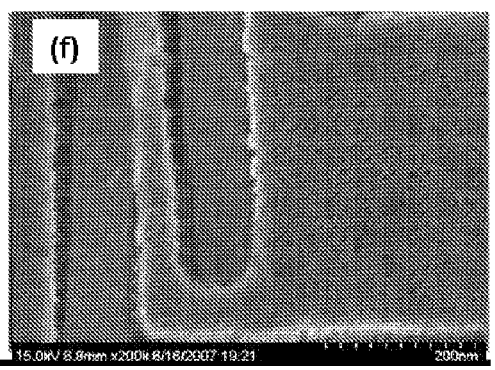
FIG. 5F is a high resolution SEM image of a linear trench pattern showing the vertical sidewall and the distinct boundary between engraved metal and porous silicon.
Figure 6A:
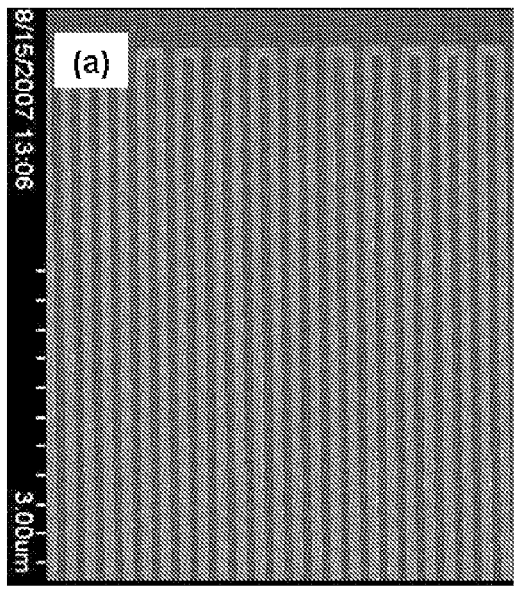
FIGS. 6A-6D are SEM images showing 3D porous structures formed from stripe patterns.
Figure 6B:
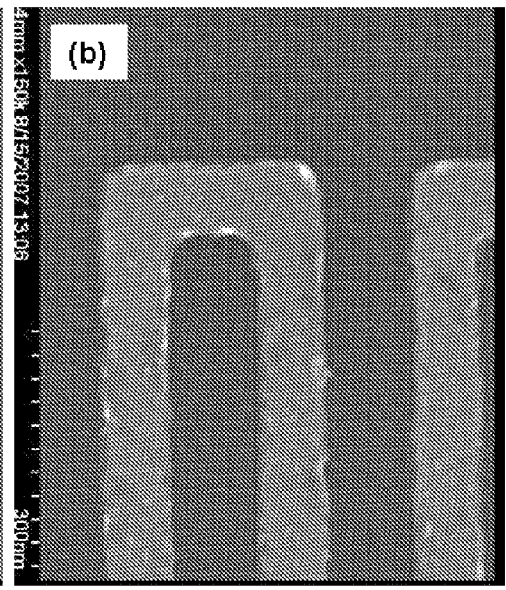
Figure 6C:
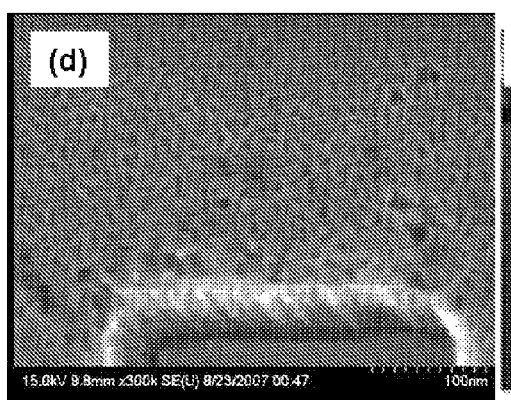
Figure 6D:
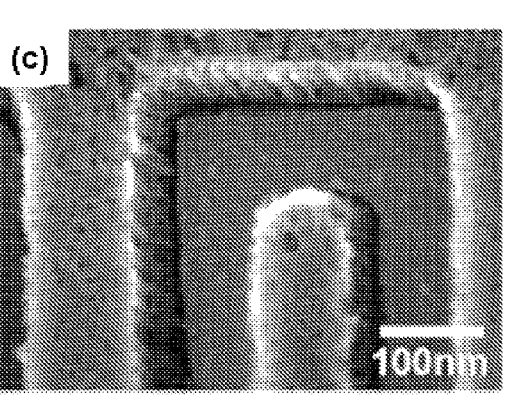

As long as metal features maintain their spatial placement during pattern development, the lateral boundary between the metal and the silicon seems to be generally well-defined using this method. The SEM image in FIG. 5F shows the interface between a near vertical porous silicon sidewall and the imprinted metal line. Since metal-assisted etching is initiated by hole ($h^+$) generation at the metal catalyst, the distinct boundary shown in FIG. 5F indicates that holes generated at the metal catalyst remain largely confined and consumed underneath the metal, even when the metal features are spaced less than 100 nm apart (although some do escape to form porous structures in between metals). This spacing is several orders of magnitude smaller than the typical hole diffusion length in $p^-$ type silicon, which implies that the hole consumption (etching) rate is much faster than the hole diffusion rate. Since the reaction front continues to move downward as the materials are removed underneath the metal, 3D nano-features fabricated using this method generally do not show undercut, in contrast to porous silicon patterned using photoresist or e-beam resist as mask.

A simple and efficient method has been presented to form nanoscale (e.g., 10-100 nm) 3D patterns in porous semiconductors, such as porous silicon. In this method, a nanoscale metal pattern is used to assist differential chemical etching under and in-between metals. Material removal occurs directly underneath the metal due to the fast catalytic etching reaction. This results in the imprint of the 2D lithography metal pattern into a 3D semiconductor body. Due to the nature of the pattern development process, porous semiconductor formation is achieved in the same step, and a 3D nanoscale patterned porous semiconductor structure with vertical sidewalls can be generated. For high fidelity pattern development, it may be advantageous to ensure that metal patterns do not liftoff during etching by increasing metal adhesion and controlling the chemical etching conditions, especially for small, high aspect ratio feature dimensions. This nanoscale fabrication method is also believed to be applicable to patterning porous silicon and other semiconductor materials.

The compatibility of the porous semiconductor 3D patterning method with subsequent oxidation to form porous low-k dielectrics (e.g., $SiO_2$), followed by metal deposition/electroplating in the nanoscale trenches already seeded with metal, makes it possible to fabricate self-integrated low-k interlayer dielectrics with metal interconnects, as described above. This is a fundamentally different process for creating a Cu-low-k dielectric architecture that may play an important role in advancing the semiconductor industry roadmap as silicon technology continues its downscaling trend. The present method also provides compatibility between different device platforms to enable fabrication of thinner die stacked structures.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method of forming a nanoscale three-dimensional pattern in a porous semiconductor, the method comprising:
    depositing a continuous metal layer on a film comprising a semiconductor material;
    patterning the continuous metal layer to define a two-dimensional nanoscale metal pattern on the film, the two-dimensional nanoscale metal pattern including one or more features each havinq at least one lateral dimension of about 100 nm or less in size;
    removing semiconductor material from below the two-dimensional nanoscale metal pattern to create only substantially vertical trenches in the film, the substantially vertical trenches having a depth-to-width aspect ratio of at least about 10:1, thereby transferring the two-dimensional nanoscale metal pattern into the film to form a nanoscale three-dimensional pattern; and
    while removing the semiconductor material from below the two-dimensional nanoscale metal pattern, forming pores in remaining portions of the film adjacent to the substantially vertical trenches to create a porous film,
    thereby forming the nanoscale three-dimensional pattern in a porous semiconductor.

2. The method of claim 1, wherein the forming of the pores and the removal of the semiconductor material from below the nanoscale metal pattern comprises wet-etching of the semiconductor material and the nanoscale metal pattern.

3. The method of claim 2, wherein the wet-etching is carried out in a solution comprising hydrofluoric acid and an oxidant under open circuit.

4. The method of claim 2, wherein the wet-etching is carried out for about 90 s or less.

5. The method of claim 4, wherein the wet-etching is carried out for about 60 s or less.

6. The method of claim 1, further comprising oxidizing the porous film to form low-k dielectric features comprising a porous dielectric material having a low dielectric constant.

7. The method of claim 6, wherein the low dielectric constant is less than about 2.0.

8. The method of claim 6, wherein oxidizing the film comprises plasma curing.

9. The method of claim 6, further comprising depositing a barrier metal layer on sidewalls of the low-k dielectric features.

10. The method of claim 9, further comprising, after depositing the barrier metal layer, depositing a copper layer between adjacent low-k dielectric features, thereby creating copper interconnects surrounded by a porous low-k dielectric material.

11. The method of claim 1, further comprising removing the nanoscale metal pattern after forming the nanoscale three-dimensional pattern in the porous semiconductor.

12. The method of claim 11, wherein removing the nanoscale metal pattern comprises etching.

13. The method of claim 1, further comprising depositing under bump metallization.

14. The method of claim 1, wherein providing the film comprising the semiconductor material comprises forming a silicon film by a low temperature deposition process.

15. The method of claim 1, wherein patterning the continuous metal layer comprises using one of electron beam lithography, nanoimprint lithography and extreme ultraviolet (EUV) lithography.

16. The method of claim 1, wherein the film comprising the semiconductor material is provided on a mother die, and, after forming the nanoscale three-dimensional patterns, additional smaller dies are stacked on top of the mother die.

17. A method of forming self-integrated porous low-k dielectric insulators with copper interconnects, the method comprising:
  depositing a continuous metal layer on a film comprising a semiconductor material;
  patterning the continuous metal layer to define a two-dimensional nanoscale metal pattern on the film, the nanoscale metal pattern including one or more features each having at least one lateral dimension of about 100 nm or less in size;
  removing semiconductor material from below the two-dimensional nanoscale metal pattern to create only substantially vertical trenches in the film, the substantially vertical trenches having a depth-to-width aspect ratio of at least about 10:1, thereby transferring the two-dimensional nanoscale metal pattern into the film to form a nanoscale three-dimensional pattern; and
  while removing the semiconductor material from below the two-dimensional nanoscale metal pattern, forming pores in remaining portions of the film adjacent to the substantially vertical trenches to create a porous film;
  oxidizing the porous film to form low-k dielectric features comprising a porous dielectric material having a low dielectric constant;
  depositing a diffusion barrier metal layer on sidewalls of the low-k dielectric features; and
  depositing copper between adjacent low-k dielectric features, thereby forming self-integrated porous low-k dielectric insulators with copper interconnects.

18. The method of claim 1, wherein the two-dimensional nanoscale metal pattern adheres sufficiently to the underlying semiconductor material to exhibit lateral immobility and to maintain spatial placement during pattern transfer.

19. The method of claim 1, wherein the three-dimensional pattern formed by the substantial vertical trenches comprises an array of dots, interconnected lines, stripes, grids, mesh, or boomerang contours.

20. The method of claim 1, wherein the substantially vertical trenches comprise at least two sides meeting at a corner at an angle of about 90°, the trenches having a non-cylindrical shape.

21. The method of claim 1, wherein the lateral dimension of about 100 nm or less in size is a width, and wherein the one or more features of the two-dimensional nanoscale metal pattern have a length substantially larger than the width.

* * * * *

UNITED STATES PATENT AND TRADEMARK OFFICE
CERTIFICATE OF CORRECTION

PATENT NO. : 8,486,843 B2  Page 1 of 1
APPLICATION NO. : 13/062130
DATED : July 16, 2013
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 104 days.

Signed and Sealed this
Eighth Day of September, 2015

Michelle K. Lee
*Director of the United States Patent and Trademark Office*